United States Patent

Yamada et al.

[11] Patent Number: 6,020,059
[45] Date of Patent: Feb. 1, 2000

[54] MULTILAYER ANISOTROPIC ELECTROCONDUCTIVE ADHESIVE AND METHOD FOR MANUFACTURING SAME

[75] Inventors: Yukio Yamada; Masao Saito; Junji Shinozaki; Motohide Takeichi, all of Tochigi, Japan

[73] Assignee: Sony Chemicals Corporation, Tokyo, Japan

[21] Appl. No.: 09/121,055

[22] Filed: Jul. 23, 1998

[30] Foreign Application Priority Data

Jul. 24, 1997  [JP]  Japan ................................. 9-198398

[51] Int. Cl.[7] ................. C09J 9/02; H05K 3/32; B32B 7/12
[52] U.S. Cl. ....................... 428/328; 428/355 EP; 428/403; 428/901
[58] Field of Search ........................... 428/328, 344, 428/355 EP, 355 BL, 901, 403

[56] References Cited

U.S. PATENT DOCUMENTS

| | | | |
|---|---|---|---|
| 4,731,282 | 3/1988 | Tsukagoshi et al. | 428/220 |
| 4,740,657 | 4/1988 | Tsukagoshi et al. | 174/88 R |
| 4,844,784 | 7/1989 | Suzuki et al. | 204/180.9 |
| 5,120,665 | 6/1992 | Tsukagoshi et al. | 437/8 |
| 5,183,969 | 2/1993 | Odashima . | |
| 5,843,251 | 12/1998 | Tsukagoshi et al. | 156/64 |

FOREIGN PATENT DOCUMENTS

| | | |
|---|---|---|
| 6-283225 | 10/1984 | Japan . |
| 61-195179 | 8/1986 | Japan . |
| 1-236588 | 9/1989 | Japan . |
| 6-136333 | 5/1994 | Japan . |
| 8-311420 | 11/1996 | Japan . |
| WO 84/00461 | 2/1984 | WIPO . |

OTHER PUBLICATIONS

J. P. 61195179A Abst., Aug. 1986.
JP 6283225A Abst., Oct. 1994.
JP 1236588 Abst, Sep. 1989.
JP 4236588 Abst, Aug. 1992.

*Primary Examiner*—Daniel Zirker
*Attorney, Agent, or Firm*—Hill & Simpson

[57] ABSTRACT

A multilayer anisotropic electroconductive adhesive, comprises an anisotropic electroconductive adhesive layer and laminated to at least one side thereof an insulating adhesive layer. The anisotropic electroconductive adhesive layer comprises a film-forming resin and electroconductive particles and has a melt viscosity at 150° C. of 100 poise or higher, and the insulating adhesive layer comprises a latent curing agent and a resin having a functional group and has a melt viscosity at 150° C. of less than 100 poise.

3 Claims, 2 Drawing Sheets

MULTILAYER ANISOTROPIC ELECTROCONDUCTIVE ADHESIVE AND METHOD FOR MANUFACTURING SAME

BACKGROUND OF THE INVENTION

1. Field of the Invention

The present invention relates to an anisotropic electroconductive adhesive that is suited to high-density package employed in applications such as connections between IC chips and circuit boards, and more specifically relates to a multilayer anisotropic electroconductive adhesive capable of improving connection reliability to a level corresponding to a fine pitch, and also to a method for manufacturing this adhesive.

2. Description of the Related Art

A need for reduced weight and thickness has recently arose in connection with electronic equipment and devices containing mounted IC chips because of new developments related to such electronic equipment, and there is also a need for higher density in boards for mounting such IC chips.

Examples of methods for the high-density package of IC chips include flip-flop methods, methods featuring the use of anisotropic electroconductive adhesives, and face-down methods in which IC chips are provided with solder bumps, and such IC bare chips with solder bumps are placed on circuit boards and secured by being passed through a solder reflow furnace or subjected to the action of a heat press.

Of these methods, the simple connection techniques employing anisotropic electroconductive adhesives have come to be used. According to these techniques, an anisotropic electroconductive adhesive is placed between an IC chip and a board, electrical conductivity between electrodes constituting vertical arrays is provided through the intermediary of the electroconductive materials contained in the anisotropic electroconductive adhesive by applying heat and pressure, and electrical insularity is maintained between adjacent electrodes on the left and right by preventing contact between the electroconductive materials.

However, the pitch between the electrodes of IC chips is 10–100 $\mu$m, which is less than the pitch between LCD electrodes. In addition, applying heat and pressure to the anisotropic electroconductive adhesive imparts fluidity to the anisotropic electroconductive adhesive disposed between the electrodes constituting vertical arrays, and forces it into the gaps between the adjacent electrodes on the left and right. This is accompanied by the flowing of the electroconductive materials, thus increasing resistance to conduction, making conductivity impossible, or causing short circuits as a result of contact between the electroconductive particles flowing between adjacent electrodes on the left and right.

Anisotropic electroconductive adhesives must also be applicable to IC stud bumps, whose surface area has recently been reduced to 1240 $\mu m^2$ (40 $\mu$m diameter), which is ⅓ to ¼ of the area of the previously used COG (Chip On Glass) plating bumps. A resulting drawback is that a large number of electroconductive particles are needed for securing such particles on a bump.

Japanese Patent Application Laid-Open Nos. 61-195179, 1-236588, 4-236588, 6-283225 and the like describe techniques aimed at overcoming this drawback. According to these techniques, an insulating adhesive layer is formed on an anisotropic electroconductive adhesive layer, and the softening point or melt viscosity of the anisotropic electroconductive adhesive layer is raised above that of the insulating adhesive layer, or the fluidity of the anisotropic electroconductive adhesive layer is brought below that of the insulating adhesive layer, making it more difficult for electroconductive materials to flow from between the electrodes constituting vertical arrays.

These techniques, however, are still unable to prevent short circuits from being caused by contact between the electroconductive particles present in the gaps between adjacent electrodes on the left and right. It is possible to reduce the particle diameter of the electroconductive materials, but excessive reduction causes an additional problem of secondary aggregation.

Due to their high contact reliability, thermosetting anisotropic electroconductive adhesives are primarily used at present. Microcapsulated latent curing agents, which contain epoxy resins having functional groups as their essential components and which are obtained by applying polyurethane resins to an imidazole that is inert at normal temperature but is activated under heat, are commonly used with such thermosetting anisotropic electroconductive adhesives.

To manufacture a multilayer anisotropic electroconductive adhesive utilizing such a thermosetting anisotropic electroconductive adhesive, the layer containing a latent curing agent is passed several times through a hot oven. A drawback is that the polyurethane resin coat on the latent curing agent is broken by the heat in the oven, initiating a reaction and making it impossible to obtain a finished product.

To address this problem, it has been proposed to simultaneously apply an anisotropic electroconductive adhesive and an insulating adhesive to a release film through a plurality of nozzles of an extrusion coater or the like. This technique, while effective with a very thin adhesive layer, causes a new problem: a multilayer anisotropic electroconductive adhesive of 25 $\mu$m or greater allows only part of the contained solvent to vaporize, resulting in the buildup of residual solvent or in the formation of gas bubbles in the adhesive layer, and adversely affecting the functioning of the finished product.

SUMMARY OF THE INVENTION

An object of the present invention, which is aimed at overcoming the aforementioned shortcomings, is to provide a multilayer anisotropic electroconductive adhesive whose quality and reliability are even higher than those of conventional multilayer anisotropic electroconductive adhesives, and to provide a method for manufacturing thus adhesive.

The inventors perfected the present invention upon discovering that the following approach allows an anisotropic electroconductive adhesive layer to be passed a plurality of times through a hot oven during manufacturing, and a latent curing agent contained in an insulating adhesive to be prevented from initiating a reaction due to the heat-induced melting of the coat on the curing agent: the latent curing agent is added to an insulating adhesive rather than to the anisotropic electroconductive adhesive; the melt viscosity of the anisotropic electroconductive adhesive at 150° C. is raised above the melt viscosity of the insulating adhesive layer at 150° C.; specific numerical values are indicated for each melt viscosity at 150° C.; electroconductive particles whose outermost layer is a coating layer of an insulating resin insoluble in adhesives are added to the anisotropic electroconductive adhesive, achieving suitability for fine-pitch circuits; and these are manufactured by a method in which a latent curing agent is added to the insulating adhesive alone but not to the anisotropic electroconductive adhesive.

Specifically, the present invention provides a multilayer anisotropic electroconductive adhesive, comprising an anisotropic electroconductive adhesive layer and laminated to at least one side thereof an insulating adhesive layer, wherein the anisotropic electroconductive adhesive layer comprises a film-forming resin and electroconductive particles and has a melt viscosity at 150° C. of 100 poise or higher, and the insulating adhesive layer comprises a latent curing agent and a resin having a functional group and has a melt viscosity at 150° C. of less than 100 poise.

The present invention also provides a method for manufacturing a multilayer anisotropic electroconductive adhesive, comprising:

a step of applying an anisotropic electroconductive adhesive containing a film-forming resin and electroconductive particles to a first release film, followed by drying to form an anisotropic electroconductive adhesive layer; and a step of applying an insulating adhesive containing a latent curing agent and a resin having functional groups to the anisotropic electroconductive adhesive layer 2, followed by drying to form a first insulating adhesive layer.

The present invention further provides a connected structure comprising an IC chip and a circuit board, the electrodes of the IC chip and the electrodes of the circuit board being connected each other by means of the multilayer anisotropic electroconductive adhesive of the present invention.

These and other objects, features and advantages of the present invention are described in or will become apparent from the following detailed description of the invention.

DETAILED DESCRIPTION OF THE INVENTION

The present invention will now be described in detail with reference to the accompanying drawings.

Figure 1:
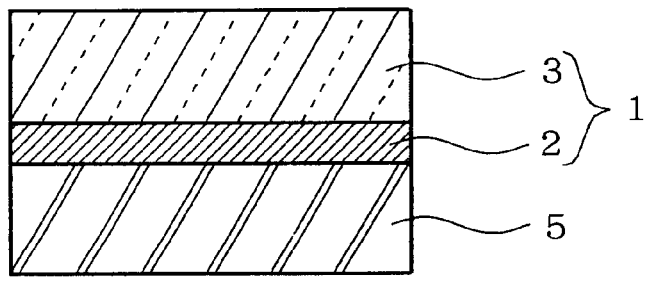
FIG. 1 is a cross section depicting an example of the multilayer anisotropic electroconductive adhesive of the present invention.

As shown in FIG. 1, a multilayer anisotropic electroconductive adhesive 1 of the present invention comprises, an anisotropic electroconductive adhesive layer 2 and laminated to at least one side thereof an insulating adhesive layer 3, where the anisotropic electroconductive adhesive layer 2 comprises a film-forming resin and electroconductive particles 11 (see FIG. 4) and has a melt viscosity at 150° C. of 100 poise or higher, and the insulating adhesive layer 3 comprises a latent curing agent and a resin having a functional group and has a melt viscosity at 150° C. of less than 100 poise.

In the present invention, the anisotropic electroconductive adhesive layer 2 has preferably a melt viscosity at 150° C. of 100 poise or higher but no more than 300 poise, and the insulating adhesive layer 3 has preferably a melt viscosity at 150° C. of 30 poise or higher but less than 100 poise.

In the present invention, the electroconductive particles 11 are preferably coated with an insulating resin that is insoluble in the anisotropic electroconductive adhesive, and have preferably a diameter of 2–7 µm and are also preferebly contained in the anisotropic electroconductive adhesive layer 2 in an amount of 5–60 vol %.

Figure 2:
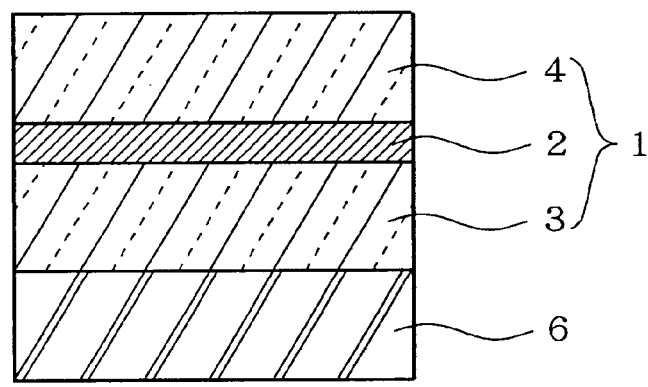
FIG. 2 is a cross section depicting another example of the present invention.

FIG. 2 is another example of the multilayer anisotropic electroconductive adhesive 1 of the present invention, in which the anisotropic electroconductive adhesive layer 2 is sandwiched between the (first) insulating adhesive layer 3 and a second insulating adhesive 4 having the same latent curing agent and resin as the (first) insulating adhesive layer 3, and a second release layer 6 is provided on the side of the insulating adhesive layer 3.

Figure 4:
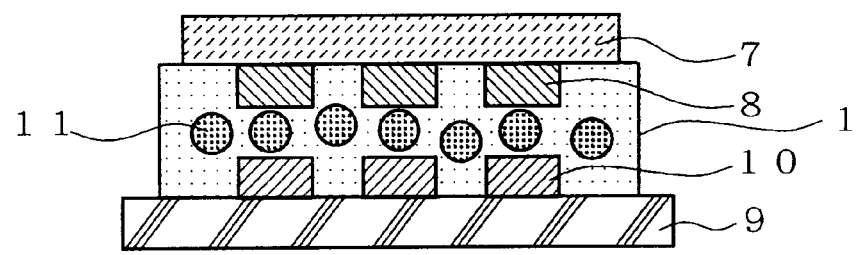
FIG. 4 is a cross section depicting a connected structure obtained by connecting an IC chip and a circuit board by means of a multilayer anisotropic electroconductive adhesive.

As shown in FIG. 4, in the present invention applied to a connected structure obtained by connecting the electrodes 8 of an IC chip 7 and the electrodes 10 of a circuit board 9 by means of the multilayer anisotropic electroconductive adhesive 1, as shown in FIG. 4. the thickness of the insulating adhesive layer 3 is preferebly 0.7–1.5 times the thickness of the electrodes 8 of the IC chip 7 and the electrodes 10 of the circuit board 9, the thickness of the anisotropic electroconductive adhesive layer 2 is 0.5–3 times the diameter of the electroconductive particles 11 dispersed in the anisotropic electroconductive adhesive, and the thickness of the multilayer anisotropic electroconductive adhesive 1 is 0.8–2 times the thickness of the electrodes 8 of the IC chip 7 and the thickness of the electrodes 10 of the circuit board 9.

Figure 3A:
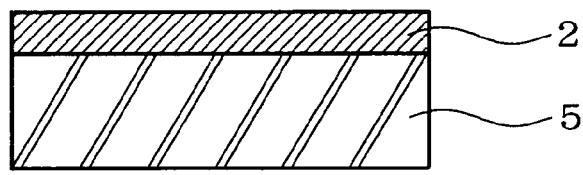
FIGS. 3A to 3C are diagrams depicting an example of steps for manufacturing the multilayer anisotropic electroconductive adhesive of the present invention.
Figure 3B:
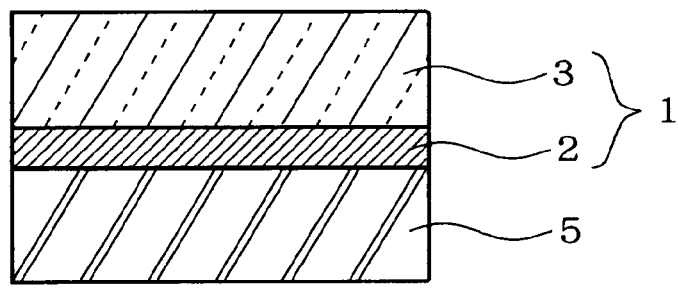

A method for manufacturing the multilayer anisotropic electroconductive adhesive 1 of the present invention, as shown in FIG. 3, comprises:

a step of applying an anisotropic electroconductive adhesive containing a film-forming resin and electroconductive particles to a first release film 5, followed by drying to form an anisotropic electroconductive adhesive layer 2 (FIG. 3A); and a step of applying an insulating adhesive containing a latent curing agent and a resin having functional groups to the anisotropic electroconductive adhesive layer 2, followed by drying to form a first insulating adhesive layer 3 (FIG. 3B).

Figure 3C:
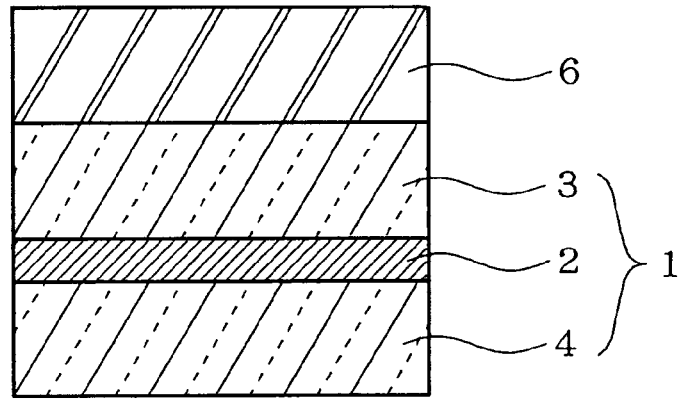

Another method of manufacturing the multilayer anisotropic electroconductive adhesives of the present invention, comprises:

a step of an anisotropic electroconductive adhesive containing a film-forming resin and electroconductive particles to a first release film 5, followed by drying to form an anisotropic electroconductive adhesive layer 2 (FIG. 3A), where the electroconductive particles 11 are coated with an insulating resin that is insoluble in the anisotropic electroconductive adhesive;

a step of an insulating adhesive containing a latent curing agent and a resin having functional groups to the anisotropic electroconductive adhesive layer 2, followed by drying to form a first insulating adhesive 3 (FIG. 3B);

a step of laminating a second release film 6 having a greater peel force than the first release film 5 to the first insulating adhesive layer 3;

a step of peeling off the first release film 5 to make the anisotropic electroconductive adhesive layer 2 exposed; and a step of applying an insulating adhesive having the same latent curing agent and resin as the insulating adhesive layer 3 to the exposed anisotropic electroconductive adhesive layer 2, followed by drying to form a second insulating adhesive layer 4 (FIGS. 3C and 2).

Further method of the method for manufacturing a multilayer anisotropic electroconductive adhesive 1 of the present invention, comprises:

a step of an anisotropic electroconductive adhesive containing a film-forming resin and electroconductive particles to a first release film 5, followed by drying to form an anisotropic electroconductive adhesive layer 2 (FIG. 3A), where the electroconductive particles are coated with an insulating resin that is insoluble in the anisotropic electroconductive adhesive;

a step of an insulating adhesive containing a latent curing agent and a resin having functional groups to the anisotropic electroconductive adhesive layer 2, followed by drying to form a first insulating adhesive 3 (FIG. 3B);

a step of laminating a second release film 6 having a greater peel force than the first release film 5 to the first insulating adhesive layer 3;

a step of peeling off the first release film 5 to make the anisotropic electroconductive adhesive layer 2 exposed; and a step of laminating the second insulating adhesive layer 4, which has been obtained by applying an insulating adhesive having the same latent curing agent and resin as the insulating adhesive layer 3, to the exposed anisotropic electroconductive adhesive layer 2 (FIGS. 3C and 2)

The multilayer anisotropic electroconductive adhesive of the present invention as explained above can be preferably applied to a connected structure (FIG. 4) comprising an IC chip 7 and a circuit board 9, where by means of the multilayer anisotropic electroconductive adhesive, the electrodes 8 of the IC chip 7 and the electrodes 10 of the circuit board 9 are connected each other.

In the present invention, examples of release films 5 or 6 include those obtained by performing silicone treatments on the surfaces of polyethylene terephthalate films, polyethylene naphthalate films, and other polyester films; polyethylene, polypropylene, and other polyolefin films; and polytetrafluoroethylene and other fluorine-based films.

Of these, release films obtained by treating the surface of a polyethylene terephthalate film (PET) with silicone are preferred for use from the standpoint of characteristics, handling, and cost.

Resins that exhibit setting properties when heated or irradiated with electron beams can be widely used as the resin components of the anisotropic electroconductive adhesive. Epoxy resins, phenolic resins, and the like can be used to advantage.

The following may be used as film-forming resins: phenoxy resins, polyester resins, polyurethane resins, SEBS (styrene-ethylene-butylene-styrene block copolymers), SIS (styrene-isoprene-styrene block copolymers), NBR (acrylonitrile butadiene rubber), and the like.

Products obtained using at least one type of film-forming resin and resin exhibiting setting properties when heated or irradiated with electron beams can be used to advantage.

Of thermosetting resins, epoxy resins are especially preferred for use because of their excellent adhesiveness, heat resistance, and moisture resistance.

Further, a film-forming resin alone may also be used for the anisotropic electroconductive adhesive. In this case, using a film-forming resin alone for the anisotropic electroconductive adhesive facilitates repair, IC chip replacement, and the like when, for example, IC chip defects occur in connections between IC chips and circuit boards.

Resins that exhibit setting properties when heated or irradiated with electron beams can be widely used as the resin components of the insulating adhesive. Epoxy resins, phenolic resins, and the like can be used to advantage.

The following may be used as film-forming resins: phenoxy resins, polyester resins, polyurethane resins, SEBS (styrene-ethylene-butylene-styrene block copolymers), SIS (styrene-isoprene-styrene block copolymers), NBR (acrylonitrile butadiene rubber), and other resins.

Products obtained using at least one type of film-forming resin and setting resin can be used to advantage.

Of thermosetting resins, epoxy resins are especially preferred for use because of their excellent adhesiveness, heat resistance, and moisture resistance.

Here, epoxy resins that are solid at normal temperature or, when necessary, epoxy resins that are liquid at normal temperature may also be used as such epoxy resins.

Epoxy resins that are solid at normal temperature or epoxy resins that are liquid at normal temperature should be mixed in appropriate proportions that correspond to the desired viscosity in order to adjust the melt viscosity of the insulating adhesive.

Fillers, silane coupling agents, and the like may also be used as needed in an appropriate manner.

The melt viscosity levels of the anisotropic electroconductive adhesive and the insulating adhesive layer should preferably be such that the melt viscosity of the anisotropic electroconductive adhesive is higher than the melt viscosity of the insulating adhesive layer.

Expressed as a melt viscosity at 150° C., the melt viscosity of the anisotropic electroconductive adhesive is preferably 100–400 poise, and more preferably 100–300 poise.

The melt viscosity of the insulating adhesive layer at 150° C. is preferably 10–100 poise, and more preferably 30–100 poise.

It is also possible for the insulating adhesive layer to be formed on both sides, rather than on only one side, of the anisotropic electroconductive adhesive layer. It is also possible to adopt an approach according to which the melt viscosity of the insulating adhesive layer is increased on the side of the heat source when an IC chip or the like is connected. To adjust the melt viscosity, the amounts of the solid epoxy resin and the liquid epoxy resin to be used may be decided in an appropriate manner in accordance with the desired melt viscosity.

To prevent the electroconductive particles contained in the anisotropic electroconductive adhesive layer from flowing out of electrodes, it is preferable for the melt viscosity of either of the two insulating adhesive layers to be higher than the melt viscosity of the anisotropic electroconductive adhesive layer while remaining within the aforementioned range of melt viscosities.

Melt viscosity was measured using a flow tester (CFT-500; manufactured by Shimazu Seisakusho). An anisotropic electroconductive adhesive and an insulating adhesive layer devoid of a curing agent were each introduced into a container and measured for melt viscosity at 150° C.

Examples of electroconductive materials that can be added to the anisotropic electroconductive adhesive include metal particles such as pure metals (such as nickel, gold, silver, copper, and solder) and alloys thereof, as well as electroconductive nickel particles whose surfaces are plated with gold, those consisting of two or more types of such metal particles; electroconductive material-coated particles obtained by applying nickel/gold plating or other electroconductive materials to insulating particles such as glass beads or particles made of ceramics, synthetic resins (such as polystyrene resins, acrylic resins, and silicone resins), rubber materials (such as acrylic rubber or chloroprene rubber), or the like; and insulating material-coated electroconductive particles, which are obtained by applying insulating resins to the surfaces of metal particles or electroconductive material-coated particles. Of these, insulating material-coated electroconductive particles are preferred for use because they are more suited for the finer pitch used for connecting ICs with boards and the like.

The smaller the diameter, the more suitable are the electroconductive particles to the fine pitch. The diameter is preferably 10 $\mu$m or less, and more preferably 2–7 $\mu$m.

It is also possible to add insulating particles (such as glass beads) or particles made of other inorganic substances (such as ceramics), organic synthetic resins (such as polystyrene resins, acrylic resins, and silicone resins), or rubber materials (such as acrylic rubber or chloroprene rubber) in order to stabilize the thickness of the material between the electrodes in vertical arrays and to improve the insulating properties of the material between the adjacent electrodes on the left and right.

To epoxy resins, amine compounds and imidazole compounds can be used to advantage as the curing agents for the insulating adhesive. Of these, curing agents based on imidazole compounds are even more suitable.

It is possible to use microcapsulated latent curing agents which are obtained by the coating of imidazole with a polyurethane resin and which are inactive at normal temperature but are activated by heating. The Novacure series (registered trade name; manufactured by Asahi Chemical Industry) and the like can be used to advantage as such curing agents.

The thickness of the anisotropic electroconductive adhesive layer preferably is 5–25 $\mu$m. If the thickness is less than 5 $\mu$m, the proportion of the anisotropic electroconductive adhesive will be low when it is fashioned into a multilayer anisotropic electroconductive adhesive, making it impossible for the anisotropic electroconductive adhesive to fully perform its functions. At a thickness greater than 25 $\mu$m, the thermosetting anisotropic electroconductive adhesive cannot perform its functions when, for example, the principal component of the anisotropic electroconductive adhesive is a film-forming resin alone.

Although the thickness of the insulating adhesive layer is affected by the thickness of the anisotropic electroconductive adhesive layer, the thickness of a single layer should preferably fall within a range of 10–50 $\mu$m. Strictly speaking, the thickness of the multilayer anisotropic electroconductive adhesive is determined by the electrode height (thickness) of the IC and circuit board being used, but a range of 50–90 $\mu$m is preferred for use.

A common gravure coater, offset gravure coater, roll coater, reverse roll coater, kiss coater, or other coater head is subsequently used as a manufacturing apparatus. Hot ovens; devices for drying/crosslinking material by means of electron beams, ultraviolet radiation, or the like; or other types of equipment may be used singly or in combinations.

The proposed multilayer anisotropic electroconductive adhesive, which is obtained by a method in which an insulating adhesive layer is laminated to at least one side of an anisotropic electroconductive adhesive layer produced by dispersing electroconductive particles in an insulating resin, is such that the resulting anisotropic electroconductive adhesive layer contains a film-forming resin and electroconductive particles as its essential components, and the essential components of the insulating adhesive layer are a latent curing agent and a resin having functional groups. The resulting product functions as a thermosetting adhesive when made into a multilayer anisotropic electroconductive adhesive, but has thermoplastic functions when the anisotropic electroconductive adhesive layer contains only a film-forming resin and electroconductive particles, facilitating repair, IC chip replacement, and the like.

Another merit is that because the anisotropic electroconductive adhesive layer is devoid of curing agents, it does not harden when passed a plurality of times through a hot oven during manufacturing, and performs its functions as an anisotropic electroconductive adhesive.

EXAMPLES

The present invention will now be described in further detail through practical examples, but the present invention is not limited by these.

Example 1

(1) Fabrication of Anisotropic Electroconductive Adhesive

The weight ratio of a phenoxy resin (YP50, manufactured by Toto Kasei), a solid epoxy resin (EP1009, manufactured by Yuka Shell), and a novolak-type liquid epoxy resin (RE305S, manufactured by Nippon Kayaku) was set to 40/30/30, and these ingredients were dissolved in a mixed solvent whose methyl ethyl ketone (MEK)/toluene weight ratio had been set to 50/50, yielding a 40% solution.

The following insulating material-coated electroconductive particles were mixed with and dispersed in this solution in an amount of 27 vol %: electroconductive particles obtained by plating benzoguanamine resin particles of 4.6 $\mu$m diameter with nickel/gold to a thickness of 0.2 $\mu$m/0.02 $\mu$m, and the surfaces of the resulting electroconductive particles were coated with an acrylic/styrene copolymer resin to a thickness of 0.2–0.5 $\mu$m.

The solvent of this anisotropic electroconductive adhesive was vaporized, and the melt viscosity of the product at 150° C. was measured with a flow tester and found to be 200 poise.

(2) Fabrication of Insulating Adhesive

The ratio of the following three components was set to 40/30/30: a solid epoxy resin (EP1009, manufactured by Yuka Shell), a novolak-type liquid epoxy resin (RE305S, manufactured by Nippon Kayaku), and HX3941HP (manufactured by Asahi Chemical Industry) dispersed in a liquid epoxy resin containing a microcapsulated latent curing agent obtained by coating a modified imidazole with a polyurethane resin. These were dissolved in a mixed solvent whose toluene/ethyl acetate weight ratio had been set to 50/50, yielding a 60% solution. The solvent of this insulating adhesive was vaporized, and the melt viscosity of the product at 150° C. was measured with a flow tester and found to be 60 poise.

The measurements were conducted after the curing agent had been removed.

(3) Fabrication of Multilayer Anisotropic Electroconductive Adhesive

The anisotropic electroconductive adhesive solution prepared in the above Fablication (1) was applied with a roll coater to a silicone-treated PET release film (hereinafter abbreviated as "a release film"), and then dried for 5 minutes at 80° C., yielding an anisotropic electroconductive adhesive layer with a thickness of 10 $\mu$m.

The insulating adhesive solution prepared in (2) was subsequently applied with a roll coater to the anisotropic electroconductive adhesive layer and then dried for 5 minutes at 80° C. A release film having a greater peel force than the release film used above was laminated, yielding an insulating adhesive layer with a thickness of 20 μm.

The insulating adhesive solution prepared in (2) was then applied with a roll coater to the surface of the anisotropic electroconductive adhesive layer from which the release film had been removed, and the product was dried for 5 minutes at 80° C., yielding an insulating adhesive layer with a thickness of 40 μm.

(4) Evaluation (a) Gas bubbles in Multilayer Anisotropic Electroconductive Adhesive Ten arbitrary areas on a multilayer anisotropic electroconductive adhesive were selected and evaluated using an optical microscope at a magnification of 170. Cases in which there were no gas bubbles larger than 30 μm were designated as "good," and cases in which gas bubbles larger than 30 μm were present were designated as "poor."

(b) Outward Appearance of Multilayer Anisotropic Electroconductive Adhesive

A multilayer anisotropic electroconductive adhesive was visually observed and evaluated.

Cases in which there were no stripes were designated as "good," and cases in which the presence of stripes was noted were designated as "poor."

(c) Service Life of Multilayer Anisotropic Electroconductive Adhesive

It was determined whether a multilayer anisotropic electroconductive adhesive was suitable for use after being aged for 24 hours in a 60° C. oven.

15 mg samples were heated at a temperature increase rate of 10° C./min and evaluated using a differential calorimeter (manufactured by Seiko Denshi Kogyo). Cases in which the peaks were at 180 mJ or higher were designated as "good," and cases in which the peaks were below 180 mJ were designated as "poor."

(d) Number of Electroconductive Particles per Electrode of IC Chip

IC chips and circuit boards for connection were prepared prior to evaluation.

The ICs used as samples had a thickness of 0.4 mm and a size of 10 mm square. IC electrodes (bumps) were gold-plated, had a height of 45 μm, and a size of 110 μm square. The bump pitch was 150 μm. 160-pin IC chips were prepared. Circuit boards were obtained by laminating an 18 μm copper foil to a glass/epoxy substrate with a thickness of 0.6 mm. Terminals plated with nickel/gold were prepared for connection with the IC chips.

A multilayer anisotropic electroconductive adhesive was placed between the IC chips and the circuit boards, and the two were compression-bonded for 20 seconds at a temperature of 180° C. and a pressure of 400 kgf/cm$^2$ per bump.

Electronic parts obtained by connecting IC chips and circuit boards by means of the multilayer anisotropic electroconductive adhesive were examined using an optical microscope at a magnification of 340 to determine the number of electroconductive particles remaining on each bump of an IC chip after this chip had been peeled off. (200 bumps were examined.) The results were deemed acceptable if each of the 200 bumps retained at least five particles.

(e) Conduction Reliability

The same samples were employed as those used for evaluating the number of electroconductive particles per bump of the aforementioned IC chips.

The evaluation samples were aged for 24 hours in a pressure-cooker tester (EHS-411, manufactured by Tabai Espec Corporation).

Conduction resistance between the electrodes of a vertical array was measured using the aged samples. Cases in which the conduction resistance was 0.1Ω or less were designated as "good," and cases in which the resistance exceeded 0.1Ω were designated as "poor."

(f) Insulation Reliability

Insulation resistance between adjacent electrodes on the left and right was measured using samples prepared under the same conditions as those used for evaluating the aforementioned conduction reliability. Cases in which the insulation resistance was 1×10$^8$Ω or higher were designated as "good," and cases in which the insulation resistance was less than 1×10$^8$Ω were designated as "poor." The results of the practical examples are shown in Table 1.

Example 2

The same procedures as those performed in Example 1 were carried out, except that a phenoxy resin (YP50, manufactured by Toto Kasei) alone was used for the resin composition of the anisotropic electroconductive adhesive, and this resin was dissolved in an MEK solvent, yielding a 40% solution. The anisotropic electroconductive adhesive used in Example 2 had a melt viscosity of 270 poise at 150° C.

Example 3

The resin composition of the anisotropic electroconductive adhesive consisted of a polyester resin (UE3220, manufactured by Unitika) and an epoxy resin (EP828, manufactured by Yuka Shell) in a weight ratio of 1/1. The resins were dissolved in a solvent containing toluene and MEK in a weight ratio of 1/1. The anisotropic electroconductive adhesive used in Practical Example 3 had a melt viscosity of 120 poise at 150° C.

Example 4

This example was identical to Example 1, except that the mixing ratio of the electroconductive particles in the anisotropic electroconductive adhesive was set to 54 vol %.

Example 5

The anisotropic electroconductive adhesive solution used in Example 1 was applied with a roll coater to a release film and then dried for 5 minutes at 80° C., yielding an anisotropic electroconductive adhesive layer with a thickness of 10 μm.

The insulating adhesive solution used in Example 1 was subsequently applied with a roll coater to the anisotropic electroconductive adhesive layer and then dried for 5 minutes at 80° C. A release film was laminated, yielding an insulating adhesive layer with a thickness of 20 μm.

The same solution as the aforementioned insulating adhesive was further applied to the release film, and the taken-up insulating adhesive film was laminated at a line pressure of 2 kgf/cm between a vertical pair of 60° C. rolls to the surface of the anisotropic electroconductive adhesive layer from which the release film had been removed.

Example 6

This example was identical to Example 1, except that the amount in which the electroconductive particles were admixed into the anisotropic electroconductive adhesive was set to 5 vol %.

Example 7

This example was identical to Example 1, except that the amount in which the electroconductive particles were admixed into the anisotropic electroconductive adhesive was set to 60 vol %.

Example 8

This example was identical to Example 2, except that the thickness of the anisotropic electroconductive adhesive was set to 25 μm, and the thickness of the ultimately applied insulating adhesive was set to 20 μm.

Comparative Example 1

The resin composition of the anisotropic electroconductive adhesive consisted of a phenoxy resin (YP50, manufactured by Toto Kasei), an epoxy resin (EP828, manufactured by Yuka Shell), and a liquid epoxy resin (HX3941HP, manufactured by Asahi Chemical Industry) containing a latent curing agent. The weight ratio of the resins was 50/50/50. The resins were dissolved in a solvent containing toluene and ethyl acetate in a weight ratio of 1/1. Otherwise the example was identical to Example 1.

The anisotropic electroconductive adhesive used in Comparative Example 1 had a melt viscosity of 60 poise at 150° C. Since the anisotropic electroconductive adhesive contained a latent curing agent, curing started during the manufacture of the multilayer anisotropic electroconductive adhesive, making it impossible to obtain satisfactory characteristics.

Comparative Example 2

The multilayer anisotropic electroconductive adhesive used in Comparative Example 1 was manufactured by a method based on the lamination technique employed in Example 2.

Because the anisotropic electroconductive adhesive had a melt viscosity of 60 poise at 150° C., the electroconductive particles contained in the anisotropic electroconductive adhesive flowed over the electrodes of IC chips during the thermocompression bonding of the IC chips and circuit boards, making it impossible to obtain satisfactory characteristics even with a manufacturing method based on lamination.

Comparative Example 3

The resin composition of the anisotropic electroconductive adhesive consisted of a phenoxy resin (YP50, manufactured by Toto Kasei) and an epoxy resin (EP828, manufactured by Yuka Shell) in a weight ratio of 50/50. The resins were dissolved in a mixed solvent in which the toluene/ethyl acetate weight ratio was 1/1. Otherwise the example was identical to Example 1.

Since the anisotropic electroconductive adhesive had a melt viscosity of 90 poise at 150° C., the electroconductive particles contained in the anisotropic electroconductive adhesive flowed over the bumps of the IC chips, resulting in unsatisfactory conduction reliability.

TABLE 1

| Evaluated items | Gas bubbles | Outward appearance | Service Life | Number of particles on bump | Conduction reliability | Insulation reliability |
|---|---|---|---|---|---|---|
| Examples | | | | | | |
| 1 | good | good | good | 10 | good | good |
| 2 | good | good | good | 10 | good | good |
| 3 | good | good | good | 10 | good | good |
| 4 | good | good | good | 15 | good | good |
| 5 | good | good | good | 10 | good | good |
| 6 | good | good | good | 5 | good | good |
| 7 | good | good | good | 20 | good | good |
| 8 | good | good | good | 10 | good | good |
| Comparative Examples | | | | | | |
| 1 | good | poor | poor | 5 | poor | good |
| 2 | poor | poor | good | 5 | poor | good |
| 3 | good | good | good | 4 | poor | good |

As described in detail above, the present invention entails adding an insulating adhesive alone to an anisotropic electroconductive adhesive without adding a latent curing agent, thus making it possible to provide a multilayer anisotropic electroconductive adhesive that allows a layer of the multilayer anisotropic electroconductive adhesive be passed a plurality of times through a hot oven during the manufacture of this multilayer anisotropic electroconductive adhesive.

It is also possible, by adopting an approach in which the melt viscosity of the anisotropic electroconductive adhesive at 150° C. is raised above the melt viscosity of the insulating adhesive layer at 150° C., and specific numerical values are indicated for each melt viscosity at 150° C., to provide a multilayer anisotropic electroconductive adhesive that allows connections between IC chips and circuit boards to remain sufficiently reliable even after being aged.

In addition, adding essential components whose outermost layer is coated with an insulating resin insoluble in adhesives to the anisotropic electroconductive adhesive makes it possible to add more electroconductive particles than commonly used and to provide a multilayer anisotropic electroconductive adhesive that can be used with fine-pitch circuits.

The entire disclosure of the specification, claims, summary and drawings of Japanese Patent Application No. 9-198398 is herein incorporated by reference in its entirety.

What is claimed is:

1. A multilayer anisotropic electroconductive adhesive comprising:

an anisotropic electroconductive adhesive layer comprising a film-forming resin and electroconductive particles and having a melt viscosity at 150° C. of at least 100 poise, the electroconductive particles are coated with an insulating resin that is insoluble in the anisotropic electroconductive adhesive, have a diameter of 2–7 μm and are contained in the anisotropic electroconductive adhesive layer in an amount of 5–60 vol %;

an insulating adhesive layer laminated to at least one side of the anisotropic electroconductive adhesive layer, the insulating adhesive layer comprising a latent curing agent and a resin exhibiting setting properties and having a melt viscosity at 150° C. of less than 100 poise.

2. A multilayer anisotropic electroconductive adhesive according to claim 1, wherein the anisotropic electroconductive adhesive layer has a melt viscosity at 150° C. of 100 poise or higher but no more than 300 poise, and the insulating adhesive layer has a melt viscosity at 150° C. of 30 poise or higher but less than 100 poise.

3. A multilayer anisotropic electroconductive adhesive according to claim 1, wherein, in a connected structure obtained by connecting the electrodes of an IC chip and the electrodes of a circuit board by means of the multilayer anisotropic electroconductive adhesive, the thickness of the insulating adhesive layer is 0.7–1.5 times the thickness of the electrodes of the IC chip and the electrodes of the circuit board, the thickness of the anisotropic electroconductive adhesive layer is 0.5–3 times the diameter of the electroconductive particles dispersed in the anisotropic electroconductive adhesive, and the thickness of the multilayer anisotropic electroconductive adhesive is 0.8–2 times the thickness of the electrodes of the IC chip and the thickness of the electrodes of the circuit board.

* * * * *